US012756178B2

(12) United States Patent
Tsai et al.

(10) Patent No.: US 12,756,178 B2
(45) Date of Patent: Oct. 6, 2026

(54) POWER SUPPLY OVER-VOLTAGE PROTECTION SYSTEM

(71) Applicant: Quanta Computer Inc., Taoyuan City (TW)

(72) Inventors: Chih-Chang Tsai, Taoyuan City (TW); Kuang-Hua Ou Yang, Taoyuan City (TW); Shu-Chen Ni, Taoyuan City (TW)

(73) Assignee: Quanta Computer Inc., Taoyuan City (TW)

( * ) Notice: Subject to any disclaimer, the term of this patent is extended or adjusted under 35 U.S.C. 154(b) by 172 days.

(21) Appl. No.: 18/773,571

(22) Filed: Jul. 15, 2024

(65) Prior Publication Data

US 2026/0018880 A1 Jan. 15, 2026

(51) Int. Cl.
*H02H 7/20* (2006.01)
*G01R 19/165* (2006.01)
*H02H 1/00* (2006.01)
*H02M 3/156* (2006.01)

(52) U.S. Cl.
CPC ......... *H02H 7/20* (2013.01); *G01R 19/16595* (2013.01); *H02H 1/0007* (2013.01); *H02M 3/156* (2013.01)

(58) Field of Classification Search
CPC ........... G01R 19/16595; H02H 1/0007; H02H 7/20; H02M 1/32; H02M 3/156
USPC ........................................................ 361/91.5
See application file for complete search history.

(56) References Cited

U.S. PATENT DOCUMENTS

2002/0130645 A1* 9/2002 Tsai ........................ H02M 1/32 323/274
2008/0253053 A1 10/2008 Formenti

FOREIGN PATENT DOCUMENTS

CN 117674021 A 3/2024
EP 3713033 A1 * 9/2020 ................ H02J 1/12

OTHER PUBLICATIONS

TW Office Action for Application No. 113134242 mailed Jun. 27, 2025, w/ Summary, 6 pp.
TW Search Report for Application No. 113134242 mailed Jun. 27, 2025, w/ First Office Action, 1 p.

* cited by examiner

*Primary Examiner* — Kevin J Comber
(74) *Attorney, Agent, or Firm* — Nixon Peabody LLP

(57) ABSTRACT

A power supply over-voltage protection (OVP) system includes a transistor having a source terminal configured to connect to a power supply output terminal of a power supply. The transistor has a drain terminal configured to connect to a system load, and a body diode forward voltage drop. The power supply OVP system further includes a low voltage monitor circuit connected between the source terminal and a gate terminal of the transistor, and a high voltage monitor circuit connected to the source terminal and configured to be connected to a control circuit within the power supply. The low voltage monitor circuit is configured to monitor a source voltage at the source terminal and provide a gate control signal to the gate terminal. The high voltage monitor circuit is configured to monitor the source voltage at the source terminal and provide a power supply control signal to the power supply.

13 Claims, 3 Drawing Sheets

POWER SUPPLY OVER-VOLTAGE PROTECTION SYSTEM

FIELD OF THE INVENTION

The present invention relates generally to power supply over-voltage protection, and more specifically, to a system that provides two thresholds of over-voltage protection.

BACKGROUND OF THE INVENTION

Computer systems and devices generally receive electrical power through a power supply unit (PSU) that typically includes electronic components, such as a power factor circuit and a direct current (DC) to DC converter. Power is supplied through the DC to DC converter, which contains a DC voltage input and switch power converter with a feedback loop circuit. The feedback loop circuit maintains the output voltage within a nominal range to protect load devices, such as system components, from over-voltage caused damage. However, DC to DC converters, feedback loop circuits, and other PSU components can fail or become faulty. Such failure or faulty operation can cause problems for proper operation of the load devices or damage to the load devices.

Existing PSUs include an over-voltage protection circuit that requires firmware management to turn off the PSU when an over-voltage condition occurs. Existing over-voltage protection systems have only a single voltage level threshold for triggering a PSU shutdown. A need exists for an over-voltage protection system having two voltage level thresholds to provide additional safety against an over-voltage condition.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a power supply over-voltage protection (OVP) system comprises a transistor. The transistor has a source terminal configured to connect to a power supply output terminal of a power supply. The transistor has a drain terminal configured to connect to a system load. The transistor has a body diode forward voltage drop between the source terminal and the drain terminal. The power supply OVP system further comprises a low voltage monitor circuit connected between the source terminal and a gate terminal of the transistor. The low voltage monitor circuit is configured to monitor a source voltage at the source terminal and provide a gate control signal to the gate terminal, the gate control signal determined by the source voltage. The power supply OVP system further comprises a high voltage monitor circuit connected to the source terminal and configured to be connected to a control circuit within the power supply. The high voltage monitor circuit is configured to monitor the source voltage at the source terminal and provide a power supply control signal to the power supply, the power supply control signal determined by the source voltage.

According to certain aspects of the present disclosure, the low voltage monitoring circuit, upon determining the source voltage to be below a first threshold voltage level, configures the gate control signal to turn the transistor on. The low voltage monitor circuit, upon determining the source voltage to be equal to or greater than the first threshold voltage level and less than a second threshold voltage level, configures the gate control signal to turn the transistor off. The high voltage monitor circuit, upon determining the source voltage to be equal to or greater than the second threshold voltage level, configures the power supply control signal to cause the control circuit within the power supply to turn off power delivered to the power supply output terminal.

According to certain aspects of the present disclosure, when the transistor is on, a load voltage at the drain terminal is equal to the source voltage. When the transistor is off, the load voltage at the drain terminal is equal to the source voltage minus the body diode forward voltage drop.

According to certain aspects of the present disclosure, the control circuit within the power supply is a direct current (DC) to DC converter that supplies power to the power supply output terminal.

According to certain aspects of the present disclosure, the transistor is a metal oxide semiconductor field effect transistor (MOSFET).

According to certain aspects of the present disclosure, a power supply over-voltage protection (OVP) system, comprises a low voltage monitor circuit configured to connect between a power supply output terminal of a power supply and a system load. The low voltage monitor circuit is configured to monitor a power supply output voltage at the power supply output terminal and provide a load voltage to the system load. The load voltage is determined by a level of the power supply output voltage relative to a first threshold voltage level. The power supply OVP system further comprises a high voltage monitor circuit configured to be connected between the power supply output terminal of the power supply and a control circuit within the power supply. The high voltage monitor circuit is configured to monitor the power supply output voltage at the power supply output terminal, and turn off the power supply output voltage via the control circuit within the power supply when the power supply output voltage is equal to or greater than a second threshold voltage level.

According to certain aspects of the present disclosure, the low voltage monitor circuit comprises a transistor. The transistor has a source terminal configured to connect to the power supply output terminal of the power supply. The transistor has a drain terminal configured to connect to the system load. The transistor has a body diode forward voltage drop between the source terminal and the drain terminal.

According to certain aspects of the present disclosure, the low voltage monitor circuit, upon determining the power supply output voltage to be less than the first threshold voltage level, provides a gate control signal to a gate terminal of the transistor to turn the transistor on. The low voltage monitor circuit, upon determining the power supply output voltage to be equal to or greater than the first threshold voltage level and less than a second threshold voltage level, provides a gate control signal to the gate terminal of the transistor to turn the transistor off.

According to certain aspects of the present disclosure, when the transistor is on, the load voltage is equal to the power supply output voltage. When the transistor is off, the load voltage is equal to the power supply output voltage minus the body diode forward voltage drop.

According to certain aspects of the present disclosure, the control circuit within the power supply is a direct current (DC) to DC converter that supplies power to the power supply output terminal.

According to certain aspects of the present disclosure, the transistor is a metal oxide semiconductor field effect transistor (MOSFET).

According to certain aspects of the present disclosure, a power supply over-voltage protection (OVP) system comprises a power supply. The power supply OVP system further comprises a low voltage monitor circuit connected between a power supply output terminal of the power supply and a system load terminal. The low voltage monitor circuit is configured to monitor a power supply output voltage at the power supply output terminal, and provide a load voltage to the system load terminal. The load voltage is determined by a level of the power supply output voltage relative to a first threshold voltage level. The power supply OVP system further comprises a high voltage monitor circuit connected between the power supply output terminal of the power supply and a control circuit within the power supply. The high voltage monitor circuit is configured to monitor the power supply output voltage at the power supply output terminal, and turn off the power supply output voltage via the control circuit within the power supply when the power supply output voltage is equal to or greater than a second threshold voltage level.

According to certain aspects of the present disclosure, the low voltage monitor circuit comprises a transistor. The transistor has a source terminal connected to the power supply output terminal of the power supply. The transistor has a drain terminal connected to the system load terminal. The transistor has a body diode forward voltage drop between the source terminal and the drain terminal.

According to certain aspects of the present disclosure, the low voltage monitor circuit, upon determining the power supply output voltage to be less than the first threshold voltage level, provides a gate control signal to a gate terminal of the transistor to turn the transistor on. The low voltage monitor circuit, upon determining the power supply output voltage to be equal to or greater than the first threshold voltage level and less than a second threshold voltage level, provides a gate control signal to the gate terminal of the transistor to turn the transistor off.

According to certain aspects of the present disclosure, when the transistor is on, the load voltage is equal to the power supply output voltage. When the transistor is off, the load voltage is equal to the power supply output voltage minus the body diode forward voltage drop.

According to certain aspects of the present disclosure, the control circuit within the power supply is a direct current (DC) to DC converter that supplies power to the power supply output terminal.

According to certain aspects of the present disclosure, the transistor is a metal oxide semiconductor field effect transistor (MOSFET).

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1:
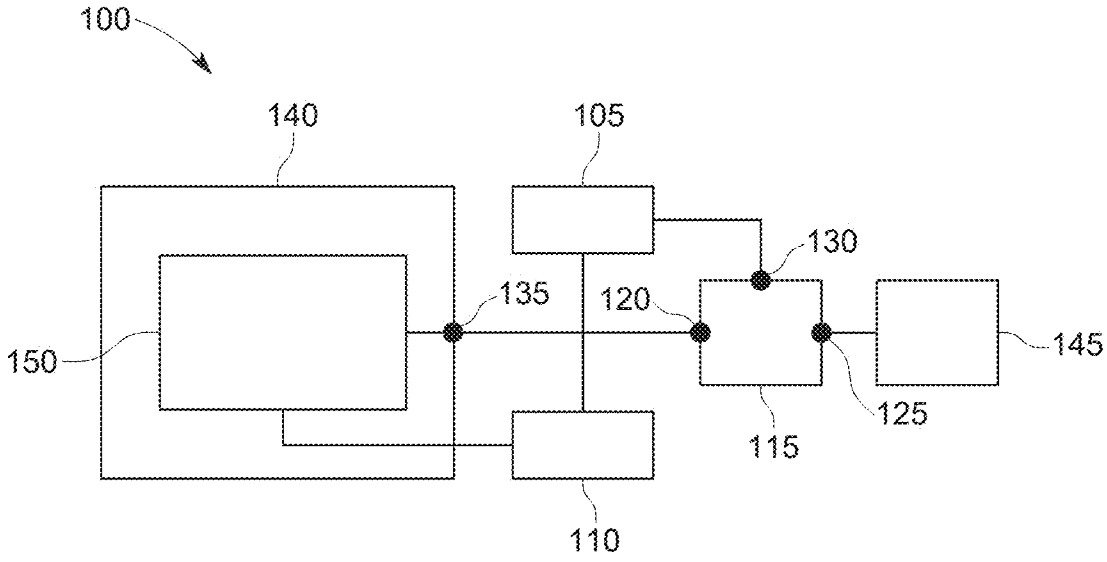
FIG. 1 is a schematic block diagram showing an exemplary over-voltage protection system, according to certain aspects of the present disclosure.

An over-voltage protection (OVP) system monitors a power supply output voltage to deliver a load voltage to a system load. The OVP system includes a low voltage monitor circuit and a high voltage monitor circuit. The low voltage monitor circuit reduces the load voltage by a predetermined voltage drop if the monitored power supply output voltage exceeds a first predetermined voltage threshold. The predetermined voltage drop is equal to an inherent body diode forward voltage drop of a transistor that is controlled by or part of the low voltage monitor circuit. The high voltage monitor circuit turns off the output of the power supply if the monitored power supply output voltage exceeds a second predetermined voltage threshold.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Referring to FIG. 1, an embodiment of an OVP system 100 includes a low voltage monitor circuit 105, a high voltage monitor circuit 110, and a transistor 115. In some embodiments, the transistor 115 is considered to be part of the low voltage monitor circuit 105. The transistor 115 includes a source terminal 120, a drain terminal 125, and a gate terminal 130. In an embodiment, the source terminal 120 is configured to connect to a power supply output terminal 135 of a power supply 140. In an embodiment, the drain terminal 125 is configured to connect to a system load 145.

In an embodiment, the transistor 115 is a metal oxide semiconductor field effect transistor (MOSFET). When the transistor 115 is off, voltage applied to the source terminal 120 is sensed at the drain terminal 125 including a body diode forward voltage drop inherent to the transistor 115 between the source terminal 120 and the drain terminal 125. It should be noted as can be seen in the configuration shown in FIG. 1, that the voltage at the source terminal 120 is the same as the voltage at the power supply output terminal 135. Henceforth, the voltage at the source terminal 120 is equivalent to and means the same thing as the voltage at the power supply output terminal 135.

In an embodiment, the low voltage monitor circuit 105 is connected between the source terminal 120 and the gate terminal 130 of the transistor 115. In an embodiment, the low voltage monitor circuit 105 is configured to monitor a source voltage at the source terminal 120 and provide a gate control signal to the gate terminal 130, where the voltage level of the gate control signal is determined via the low voltage monitor circuit 105 from the source voltage. In an embodiment, the high voltage monitor circuit 110 is connected to the source terminal 120 and configured to be connected to a control circuit 150 within the power supply 140. In an embodiment the control circuit 150 within the power supply 140 is a direct current (DC) to DC converter that supplies power to the power supply output terminal 135. In an embodiment, the high voltage monitor circuit 110 is configured to monitor the source voltage at the source terminal 120 and provide a power supply control signal to the power supply 140, where the voltage level of the power supply control signal is determined via the high voltage monitor circuit 110 from the source voltage.

Figure 2:
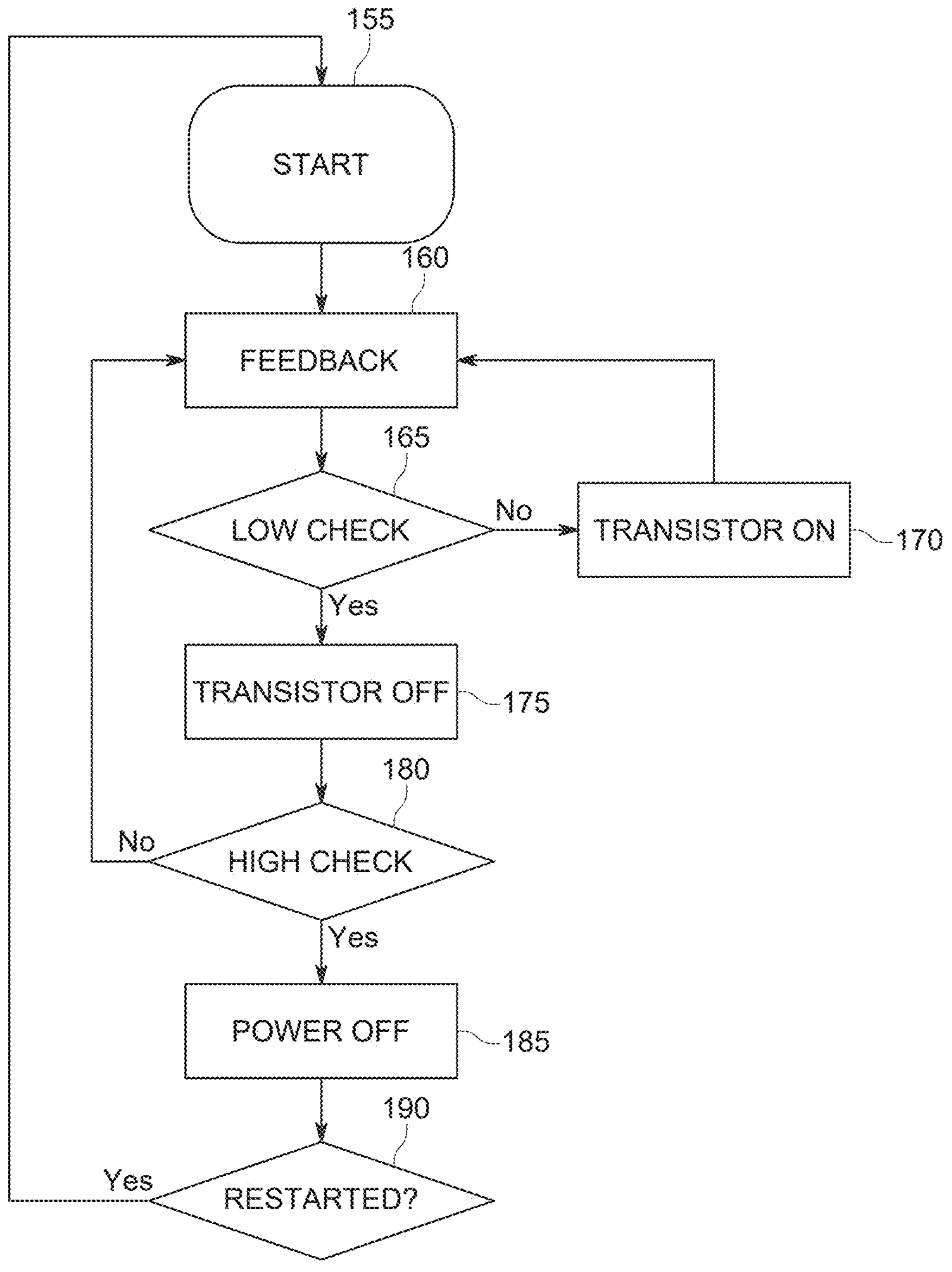
FIG. 2 is an operational flow chart of the exemplary over-voltage protection system of FIG. 1, according to certain aspects of the present disclosure.
Figure 3:
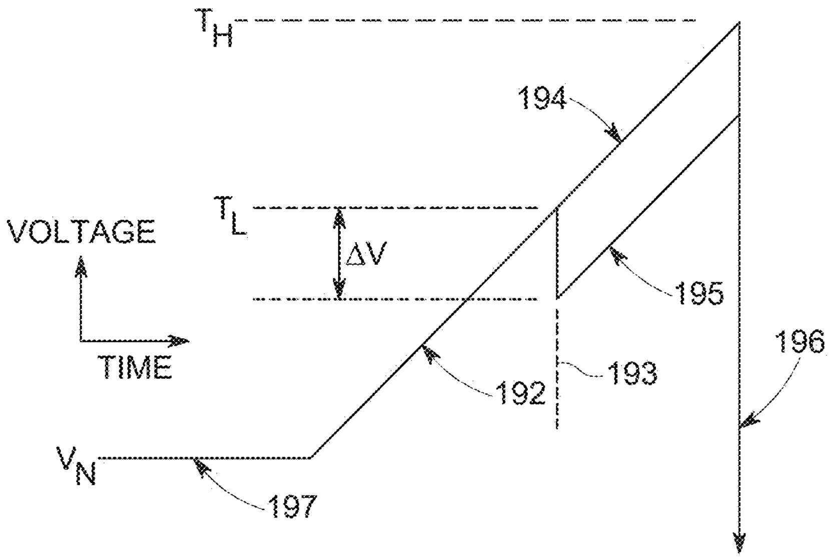
FIG. 3 is a plot of power supply output voltage and load voltage versus time for a hypothetical rising power supply output voltage for the exemplary over-voltage protection system of FIG. 1, according to certain aspects of the present disclosure.

FIG. 2 shows an operational flow chart of the exemplary over-voltage protection system 100 of FIG. 1. FIG. 3 is a plot of power supply output voltage and load voltage versus time for a hypothetical rising power supply output voltage for the exemplary over-voltage protection system of FIG. 1. Referring now to FIGS. 1-3, operation of the OVP system 100 starts at step 155 in FIG. 2. At step 155, the power supply 140 and the control circuit 150 within the power supply 140 are powered-on and provide power supply output voltage to the power supply output terminal 135. At step 155, the low voltage monitor circuit 105 configures the gate control signal to turn the transistor 115 on. At step 160, a feedback circuit internal to the power supply 140 monitors the power supply output voltage at the power supply output terminal 135, and operates to keep the power supply output voltage at or near a nominal voltage, $V_N$, which is illustrated in FIG. 3. In some embodiments, the feedback circuit is part of the control circuit 150 and in other embodiments, the feedback circuit is a circuit within the power supply 140 that is separate from the control circuit 150. Faulty operation of the control circuit 150 and/or the feedback circuit, or other components within the power supply 140 can cause the power supply output voltage at the power supply output terminal 135 to deviate outside of the nominal range of voltage.

Still referring to FIGS. 1-3, if there is a fault or failure in the power supply 140 or in one of the components in the power supply 140, the power supply output voltage can rise so that it is above the nominal voltage $V_N$, as shown by the segment of the plot indicated by reference numeral 192 in FIG. 3. At step 165 in FIG. 2, the low voltage monitor circuit 105 monitors the power supply output voltage at the power supply output terminal 135 (which is the same as the source voltage at the source terminal 120) to determine if a first threshold voltage level $T_L$ has been met or exceeded (see FIG. 3).

Upon determining that the first threshold voltage level $T_L$, has not been met or exceeded, as indicated by N, at step 170 in FIG. 2, the low voltage monitor circuit 105 configures a gate control signal to keep the transistor 115 on. In this operational state with the transistor 115 on, a load voltage at the drain terminal 125 is equal to the power supply output voltage at the power supply output terminal 135 (which is the same as the source voltage at the source terminal 120). In FIG. 3, this operational state is represented by the portion of the graph to the left of the dashed line 193.

Upon determining that the first threshold voltage level Ti, has been met or exceeded, as indicated by Y, at step 175 in FIG. 2, the low voltage monitor circuit 105 configures the gate control signal to turn the transistor 115 off. In this operational state with the transistor 115 off, a load voltage at the drain terminal 125 is equal to the source voltage at the source terminal 120 minus the body diode forward voltage drop of the transistor 115. The body diode forward voltage drop of the transistor is represented by $\Delta_V$ in FIG. 3. In this operational state, the power supply output voltage at the power supply output terminal 135 is shown by the segment of the plot indicated by reference numeral 194 to the right of dashed line 193 in FIG. 3. In this operational state, the load voltage at the drain terminal 125 is shown by the segment of the plot indicated by reference numeral 195 to the right of dashed line 193 in FIG. 3.

Still referring to FIGS. 1-3, at step 180 in FIG. 2, the high voltage monitor circuit 110 monitors the power supply output voltage at the power supply output terminal 135 (which is the same as the source voltage at the source terminal 120) to determine if the second threshold voltage level $T_H$ has been met or exceeded (see FIG. 3). If the source voltage is determined to be less than the second threshold level $T_H$ (meaning that the second threshold voltage level $T_H$ has not been met or exceeded as indicated by N), step 160 in FIG. 2 is repeated.

Upon determining the source voltage to be equal to or greater than the second threshold voltage level $T_H$ (meaning that the second threshold voltage level $T_H$ has been met or exceeded as indicated by Y), at step 185 in FIG. 2, the high voltage monitor circuit 110 configures the power supply control signal to cause the control circuit 150 within the power supply 140 to turn off power delivered to the power supply output 135. Turning off the power delivered to the power supply output 135 causes the power supply output voltage at the power supply output terminal 135 to go to zero. Turning off the power delivered to the power supply output 135 causes the load voltage at the drain terminal 125 to also go to zero. In this operational state, the power supply output voltage at the power supply output terminal 135 is shown by the segment of the plot indicated by reference numeral 196 in FIG. 3.

At step 190 in FIG. 2, the OVP system 100 triggers the power supply 140 to restart and waits for the power supply 140 to restart. Upon a restart of the power supply 140, as indicated by Y, operation of the OVP system 100 returns to step 155 in FIG. 2. In this operational state, the power supply output voltage at the power supply output terminal 135 (which is the same as the source voltage at the source terminal 120) is shown by the segment of the plot indicated by reference numeral 197 in FIG. 3.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A power supply over-voltage protection (OVP) system, comprising:

a transistor having:

a source terminal configured to connect to a power supply output terminal of a power supply;

a drain terminal configured to connect to a system load; and a body diode forward voltage drop between the source terminal and the drain terminal;

a low voltage monitor circuit connected between the source terminal and a gate terminal of the transistor, the low voltage monitor circuit being a first voltage detector with a first threshold voltage, the low voltage monitor circuit being configured to monitor a source voltage at the source terminal and provide a gate control signal to the gate terminal, the gate control signal determined by the source voltage; and a high voltage monitor circuit connected to the source terminal and configured to be connected to a control circuit within the power supply, the high voltage monitor circuit being a second voltage detector with a second threshold voltage that is higher than the first threshold voltage, the high voltage monitor circuit being configured to monitor the source voltage at the source terminal and provide a power supply control signal to the power supply, the power supply control signal determined by the source voltage;

wherein the low voltage monitor circuit, upon determining the source voltage to be below a first threshold voltage level, causes the gate control signal to keep the transistor on; and upon determining the source voltage to be equal to or greater than the first threshold voltage level and less than a second threshold voltage level, causes the gate control signal to turn the transistor off; and wherein, the high voltage monitor circuit, upon determining the source voltage to be equal to or greater than the second threshold voltage level, causes the control circuit within the power supply to turn off power delivered to the power supply output terminal.

2. The power supply OVP system of claim 1, wherein when the transistor is on, a load voltage at the drain terminal is equal to the source voltage; and wherein when the transistor is off, the load voltage at the drain terminal is equal to the source voltage minus the body diode forward voltage drop.

3. The power supply OVP system of claim 1, wherein the control circuit within the power supply is a direct current (DC) to DC converter that supplies power to the power supply output terminal.

4. The power supply OVP system of claim 1, wherein the transistor is a metal oxide semiconductor field effect transistor (MOSFET).

5. A power supply over-voltage protection (OVP) system, comprising:

a low voltage monitor circuit configured to connect between a power supply output terminal of a power supply and a system load, the low voltage monitor circuit being a first voltage detector with a first threshold voltage, the low voltage monitor circuit configured to monitor a power supply output voltage at the power supply output terminal and provide a load voltage to the system load, the load voltage determined by a level of the power supply output voltage relative to a first threshold voltage level; and a high voltage monitor circuit configured to be connected between the power supply output terminal of the power supply and a control circuit within the power supply, the high voltage monitor circuit being a second voltage detector with a second threshold voltage that is higher than the first threshold voltage, the high voltage monitor circuit configured to monitor the power supply output voltage at the power supply output terminal and turn off the power supply output voltage via the control circuit within the power supply when the power supply output voltage is equal to or greater than a second threshold voltage level;

wherein the low voltage monitor circuit comprises a transistor, the transistor having:

a source terminal configured to connect to the power supply output terminal of the power supply;

a drain terminal configured to connect to the system load; and a body diode forward voltage drop between the source terminal and the drain terminal;

wherein the low voltage monitor circuit, upon determining the power supply output voltage to be less than the first threshold voltage level, provides a gate control signal to a gate terminal of the transistor to keep the transistor on;

upon determining the power supply output voltage to be equal to or greater than the first threshold voltage level and less than a second threshold voltage level, provides a gate control signal to the gate terminal of the transistor to turn the transistor off.

6. The power supply OVP system of claim 5, wherein when the transistor is on, the load voltage is equal to the power supply output voltage; and wherein when the transistor is off, the load voltage is equal to the power supply output voltage minus the body diode forward voltage drop.

7. The power supply OVP system of claim 6, wherein the control circuit within the power supply is a direct current (DC) to DC converter that supplies power to the power supply output terminal.

8. The power supply OVP system of claim 5, wherein the transistor is a metal oxide semiconductor field effect transistor (MOSFET).

9. A power supply over-voltage protection (OVP) system, comprising:

a power supply;

a low voltage monitor circuit connected between a power supply output terminal of the power supply and a system load terminal, the low voltage monitor circuit being a first voltage detector with a first threshold voltage, the low voltage monitor circuit configured to monitor a power supply output voltage at the power supply output terminal and provide a load voltage to the system load terminal, the load voltage determined by a level of the power supply output voltage relative to a first threshold voltage level; and a high voltage monitor circuit connected between the power supply output terminal of the power supply and a control circuit within the power supply, the high voltage monitor circuit being a second voltage detector with a second threshold voltage that is higher than the first threshold voltage, the high voltage monitor circuit configured to monitor the power supply output voltage at the power supply output terminal and turn off the power supply output voltage via the control circuit within the power supply when the power supply output voltage is equal to or greater than a second threshold voltage level;

wherein the low voltage monitor circuit comprises a transistor, the transistor having:

a source terminal connected to the power supply output terminal of the power supply;

a drain terminal connected to the system load terminal; and a body diode forward voltage drop between the source terminal and the drain terminal;

wherein the low voltage monitor circuit, upon determining the power supply output voltage to be less than the first threshold voltage level, provides a gate control signal to a gate terminal of the transistor to keep the transistor on;

upon determining the power supply output voltage to be equal to or greater than the first threshold voltage level and less than a second threshold voltage level, provides a gate control signal to the gate terminal of the transistor to turn the transistor off.

10. The power supply OVP system of claim 9, wherein when the transistor is on, the load voltage is equal to the power supply output voltage; and wherein when the transistor is off, the load voltage is equal to the power supply output voltage minus the body diode forward voltage drop.

11. The power supply OVP system of claim 9, wherein the control circuit within the power supply is a direct current (DC) to DC converter that supplies power to the power supply output terminal.

12. The power supply OVP system of claim 9, wherein the transistor is a metal oxide semiconductor field effect transistor (MOSFET).

13. A power supply over-voltage protection (OVP) system, comprising:

a transistor having:

a source terminal;

a drain terminal; and a body diode;

a first voltage detector with a first threshold voltage, the first voltage detector being configured to monitor a source voltage at the source terminal and provide a gate control signal to a gate terminal, the gate control signal determined by the source voltage; and a second voltage detector with a second threshold voltage that is higher than the first threshold voltage, the second voltage detector being configured to monitor the source voltage at the source terminal and provide a power supply control signal to a power supply, the power supply control signal being determined by the source voltage;

wherein the first voltage detector, upon determining the source voltage to be below a first threshold voltage level, causes the gate control signal to keep the transistor on; and upon determining the source voltage to be equal to or greater than the first threshold voltage level and less than a second threshold voltage level, causes the gate control signal to turn the transistor off; and wherein, the second voltage detector, upon determining the source voltage to be equal to or greater than the second threshold voltage level, causes a control circuit within the power supply to turn off power delivered to a power supply output terminal.

* * * * *